United States Patent
Cho et al.

(10) Patent No.: US 9,957,426 B2
(45) Date of Patent: May 1, 2018

(54) PHOTOCURABLE ADHESIVE FILM FOR ORGANIC ELECTRONIC DEVICE SEAL, ORGANIC ELECTRONIC DEVICE AND METHOD FOR SEALING SAME

(71) Applicant: LG CHEM, LTD., Seoul (KR)

(72) Inventors: Yoon Gyung Cho, Daejeon (KR); Hyun Jee Yoo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 126 days.

(21) Appl. No.: 14/265,106

(22) Filed: Apr. 29, 2014

(65) Prior Publication Data
US 2014/0235742 A1 Aug. 21, 2014

Related U.S. Application Data

(63) Continuation of application No. PCT/KR2012/009755, filed on Nov. 16, 2012.

(30) Foreign Application Priority Data

Nov. 18, 2011 (KR) .................. 10-2011-0121220
Nov. 16, 2012 (KR) .................. 10-2012-0130260

(51) Int. Cl.

| C09J 163/00 | (2006.01) |
|---|---|
| H01L 51/52 | (2006.01) |
| H01L 51/44 | (2006.01) |
| C09J 133/06 | (2006.01) |
| C08G 59/40 | (2006.01) |
| C08G 59/68 | (2006.01) |

(52) U.S. Cl.
CPC ........ *C09J 163/00* (2013.01); *C08G 59/4028* (2013.01); *C08G 59/68* (2013.01); *C09J 133/066* (2013.01); *H01L 51/448* (2013.01); *H01L 51/524* (2013.01); *H01L 51/5246* (2013.01); *H01L 51/5259* (2013.01); *Y02E 10/549* (2013.01)

(58) Field of Classification Search
CPC ....... C09J 133/06; C09J 163/00; C08G 59/68; C08G 59/4028; H01L 51/448; H01L 51/524; H01L 51/5246; H01L 51/5259; Y02E 10/549
See application file for complete search history.

(56) References Cited

U.S. PATENT DOCUMENTS

| 2004/0084686 | A1* | 5/2004 | Wang .................. H01L 23/26 257/99 |
|---|---|---|---|
| 2006/0100299 | A1* | 5/2006 | Malik .................. C08G 59/18 522/31 |
| 2007/0170861 | A1 | 7/2007 | Lee et al. |

FOREIGN PATENT DOCUMENTS

| CN | 1662625 A | 8/2005 |
|---|---|---|
| CN | 1678639 A | 10/2005 |
| CN | 101632010 A | 1/2010 |
| JP | 2002-317172 A | 10/2002 |
| JP | 2003-197366 A | 7/2003 |
| JP | 2007-184279 A | 7/2007 |
| JP | 2008-3216 A | 1/2008 |
| JP | 2008-122897 A | 5/2008 |
| JP | 2010-126699 A | 6/2010 |
| KR | 10-2005-0047436 A | 5/2005 |
| KR | 10-2006-0020381 A | 3/2006 |
| KR | 10-2010-0037042 A | 4/2010 |
| KR | 10-2010-0069205 A | 6/2010 |
| TW | 200905940 | 2/2009 |
| TW | 201114874 A1 | 5/2011 |
| WO | 2003/106582 A1 | 12/2003 |

\* cited by examiner

*Primary Examiner* — Sanza Mcclendon
(74) *Attorney, Agent, or Firm* — Dentons US LLP

(57) ABSTRACT

Provided are a photocurable pressure-sensitive adhesive composition including an acrylic polymer, an epoxy resin, a crosslinking agent and a photopolymerization initiator, an organic electronic device having an encapsulant including the composition using a film-state product, that is, a curable pressure-sensitive adhesive film, including the composition, and a method of manufacturing an organic electronic device using the curable pressure-sensitive adhesive film. Particularly, the method includes assembling a photocurable pressure-sensitive adhesive film including an acrylic polymer, an epoxy resin, a crosslinking agent and a photopolymerization initiator with an top substrate; and assembling the top substrate to the bottom substrate on which an organic light-emitting element is formed to cover an entire surface of the organic light-emitting element with the curable pressure-sensitive adhesive layer, and radiating light only to an edge of the assembled top and bottom substrates in which the organic light-emitting element is not disposed to photocure. Therefore, mechanical strength may be ensured due to entire encapsulation, the simplification of a process by photocuring may be achieved without direct radiation of light to the organic light-emitting element, and lifespan of the element may be increased.

24 Claims, 1 Drawing Sheet

[FIG. 1]
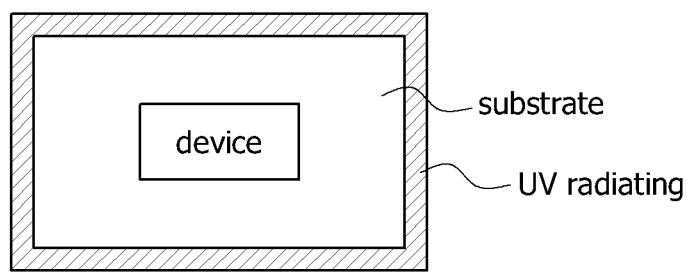
[FIG. 2]
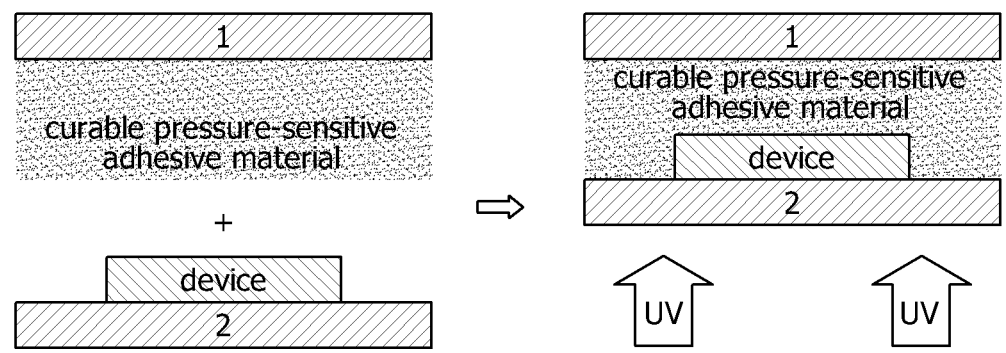

US 9,957,426 B2

PHOTOCURABLE ADHESIVE FILM FOR ORGANIC ELECTRONIC DEVICE SEAL, ORGANIC ELECTRONIC DEVICE AND METHOD FOR SEALING SAME

This application is a bypass continuation of International Application No. PCT/KR2012/009755 filed Nov. 16, 2012, which claims priority to Korean Patent Application Nos. 10-2011-0121220 filed Nov. 18, 2011 and 10-2012-0130260 filed Nov. 16, 2012, both in the Korean Intellectual Property Office, all of which are incorporated herein by reference.

BACKGROUND

1. Field of the Invention

The present invention relates to an organic electronic device, and particularly, to a photocurable pressure-sensitive adhesive composition used to encapsulate an organic electronic device, an adhesive film formed thereof, and a method for manufacturing an organic electronic device.

2. Discussion of Related Art

An organic electronic device (OED) refers to a device including an organic material layer generating the exchange of charges using holes and electrons, and for example, the OED includes a photovoltaic device, a rectifier, a transmitter and an organic light-emitting diode (OLED).

A representative OED, which is an OLED, has less power consumption and a higher response speed, and forms a thinner display device or light than a conventional light source. In addition, the OLED has excellent space utilization, and is expected to be applied in various fields including all kinds of portable devices, monitors, notebook computers and TVs.

To extend compatibility and use of the OLED, a major problem is durability. Organic materials and metal electrodes included in the OLED are very easily oxidized by external factors such as moisture, and a product including the OLED is very sensitive to environmental factors. Therefore, various methods to prevent penetration of oxygen or moisture from an external environment have been suggested.

A large-scale element has a limitation to an edge sealing method due to the deterioration of the element caused by the lack of mechanical strength and the decrease in efficiency of heat emission. Generally, an UV edge sealing or frit method in combination with a getter additionally uses a heat-curable/visible ray-curable filled adhesive, which thus makes a process complicated, resulting in an increase in cost.

In addition, while the edge sealing may improve mechanical strength and ensure a moisture barrier characteristic according to the type of filling, the edge sealing may be difficult to apply to a flexible display. The heat-curable entire surface filler is necessarily cured at low temperature to avoid damage to an element. However, since the heat-curable filler has a pot life to be cured at low temperature, processibility is degraded. The visible ray-curable filler has difficult curing conditions and a limitation to selection of a material, compared with a UV-curable filler.

In Korean Patent Publication No. 2008-0074372, a photopolymerization adhesive composition, which is present in a liquid-state at room temperature, including an epoxy resin, an acrylate resin, a cationic photopolymerization initiator and a radical photopolymerization initiator, is disclosed. When the above composition is coated on an entire surface of an organic light-emitting element, and the organic light-emitting element is assembled and encapsulated, the organic light-emitting element may be damaged due to the radiation of light. Moreover, the above method is a liquid-state method, which has many limitations.

SUMMARY OF THE INVENTION

The present invention is directed to providing an OED which may effectively encapsulate an organic light-emitting element without direct radiation of light to the organic light-emitting element, and enhance the lifespan of the element, a method of manufacturing the same, a curable pressure-sensitive adhesive composition for encapsulating the same, and a curable pressure-sensitive adhesive film.

In one aspect, the present invention provides an OED including a substrate on which an organic light-emitting element is formed, and a curable pressure-sensitive adhesive film encapsulating an entire surface of the organic light-emitting element on the substrate.

Here, the curable pressure-sensitive adhesive film includes a curable pressure-sensitive adhesive layer including a photocurable pressure-sensitive adhesive composition including an acrylic polymer, an epoxy resin, a crosslinking agent and a photoinitiator, and only an edge of the curable pressure-sensitive adhesive layer that is not directly contact with the organic light-emitting element is photocured.

In another aspect, the present invention provides a method for manufacturing an organic electronic device, including assembling a photocurable pressure-sensitive adhesive film including a curable pressure-sensitive adhesive layer including an acrylic polymer, an epoxy resin, a crosslinking agent and a photoinitiator with an top substrate, assembling the top substrate with a bottom substrate on which an organic light-emitting element is formed to cover an entire surface of the organic light-emitting element with the curable pressure-sensitive adhesive layer, and radiating light only to an edge of the assembled top and bottom substrates at which the organic light-emitting element is not disposed to photocure.

In still another aspect, the present invention provides a photocurable pressure-sensitive adhesive composition for encapsulating an OED including an acrylic polymer, an epoxy resin, a crosslinking agent and a photoinitiator.

In yet another aspect, a photocurable pressure-sensitive adhesive film for encapsulating an OED, which is a film-state product including the photocurable pressure-sensitive adhesive composition, including a curable pressure-sensitive adhesive layer having a viscosity at 25° C. of $10^5$ to $10^7$ Pa·s.

Effect

According to exemplary embodiments of the present invention, there is no damage to an element by light since light is not directly radiated to the element, and mechanical strength can be ensured and a simple process and minimum tact time can also be ensured by photocuring due to entire encapsulation of an OED panel. In addition, since an organic light-emitting element is encapsulated with a semi-solid phase curable pressure-sensitive adhesive film at room temperature, it can be applied to a flexible display.

BRIEF DESCRIPTION OF THE DRAWINGS

FIG. 1 is a plan view of an OED according to an exemplary embodiment of the present invention.

FIG. 2 is a schematic diagram showing a method for manufacturing an OED according to an exemplary embodiment of the present invention.

DETAILED DESCRIPTION OF EXEMPLARY EMBODIMENTS

With reference to the appended drawings, exemplary embodiments of the present invention will be described in detail below. To aid in understanding the present invention, like numbers refer to like elements throughout the description of the figures, and the description of the same elements will be not reiterated.

Exemplary embodiments of the present invention relate to an OED, and particularly, to a curable pressure-sensitive adhesive composition encapsulating an OED including an organic light-emitting element and a curable pressure-sensitive adhesive film. The term "organic electronic device" used herein refers to a product or device having a structure including an organic material layer generating the exchange of charges between a pair of facing electrodes using holes and electrons. The OED may include a photovoltaic device, a rectifier, a transmitter and an OLED, but the present invention is not limited thereto. In one embodiment of the present invention, the OED may be an OLED.

An OED according to one embodiment of the present invention includes a substrate on which an organic light-emitting element is formed, and an encapsulant which is a curable pressure-sensitive adhesive film encapsulating an entire surface of the organic light-emitting element on the substrate. The encapsulant includes a curable pressure-sensitive adhesive layer including a photocurable pressure-sensitive adhesive composition including an acrylic polymer, an epoxy resin, a crosslinking agent and a photoinitiator.

Particularly, only the edge of the curable pressure-sensitive adhesive layer that is not directly contact with the organic light-emitting element is photocured.

FIG. 1 is a plan view of an organic electronic device according to an exemplary embodiment of the present invention. Referring to FIG. 1, in the OED according to exemplary embodiments of the present invention, an encapsulant which is a curable pressure-sensitive adhesive film encapsulating an entire surface of an organic light-emitting element, may be photocured only on an edge surrounding a circumference of the organic light-emitting element. In one example, in an organic display device using an organic light-emitting element, the edge may be a bezel.

Unlike the conventional art in which an entire surface having an organic light-emitting element is irradiated by light, in the OLED, only an edge of a curable pressure-sensitive film entirely encapsulating an organic light-emitting element, which does not have an organic light-emitting element, is partially cured by radiating light, thereby preventing damage to an organic material expressing a color in the organic light-emitting element, and thus realizing an intrinsic color coordinate. Accordingly, the problems occurring in the conventional art performing entire encapsulation by also emitting light to the organic light-emitting element, such as a color change caused by the change in color coordinate due to the damage to an organic material, driving failure caused by the damage to a TFT element and a decrease in lifespan, may be resolved. When light is radiated to the organic light-emitting element as in the conventional art, the organic material is damaged, thereby changing a color coordinate 1% or more, or decreasing the lifespan of light emitted from the organic light-emitting element 5% or more. However, according to exemplary embodiments of the present invention, the radiation of light to the organic light-emitting element may be avoided, and the organic light-emitting element may be effectively encapsulated, thereby resolving the above-mentioned problem and providing excellent adhering performance.

The term "curable pressure-sensitive adhesive" used herein refers to a semi-solid polymer material exhibiting pressure-sensitive adhesive performance and serving as an adhesive by curing.

The OED has a structure in which the entire surface of the organic light-emitting element is encapsulated with the curable pressure-sensitive adhesive film described above. Here, the term "entire encapsulation" or "entire surface" refers to an entire area of a top surface of an organic light-emitting element, that is, a surface of the organic light-emitting element opposite to the surface thereof formed on a substrate of the OED and in contact with the substrate, and also includes side surfaces thereof. The entire encapsulation refers to the encapsulation with an encapsulant without an empty space between the organic light-emitting element and the encapsulant. That is, not spaced apart from the encapsulant, the organic light-emitting elements formed on the substrate are entirely sealed with the encapsulant formed of a curable pressure-sensitive adhesive composition without an empty space. Such an encapsulated structure is called face sealing. Even when at least one organic light-emitting element is formed on the substrate, according to exemplary embodiments of the present invention, the organic light-emitting elements may be encapsulated without step difference. The entire encapsulation only means that there is no empty space between the organic light-emitting element and an encapsulant when they are spaced apart from each other. Therefore, an additional component such as a protective layer may be included between the organic light-emitting element and an encapsulant.

In the OED according to the exemplary embodiments of the present invention, the curable pressure-sensitive adhesive film encapsulating the entire surface of the organic light-emitting element includes a curable pressure-sensitive adhesive layer including a photocurable pressure-sensitive adhesive composition including an acrylic polymer, an epoxy resin, a crosslinking agent and a photoinitiator.

The curable pressure-sensitive adhesive film may be a semi-solid phase at room temperature, and may have a viscosity of $10^5$ to $10^7$ Pa·s, and a water vapor transmission rate (WVTR) of less than 200 g/m$^2$·day. The term "room temperature" refers to a temperature in a natural environment, not increased or decreased. Room temperature may be approximately 15 to 35° C., specifically, approximately 20 to 25° C., and more specifically, approximately 25° C. The viscosity may be measured using an advanced rheometric expansion system (ARES). When the viscosity of the curable pressure-sensitive adhesive film is controlled within the above range, a burr or crack is not generated during punching, thereby easily handling the film, and the film has good work processibility during the encapsulation of the OED, thereby encapsulating the film to a uniform thickness in a planar type. In addition, the problems of contraction and generation of a volatile gas occurring when the resin is cured may be considerably reduced, thereby preventing physical or chemical damages to the OED.

According to exemplary embodiments of the present invention, as the curable pressure-sensitive adhesive film attached to the entire surface of the organic light-emitting element is partially cured by radiating light only to the edge not directly contact with the organic light-emitting element during the encapsulation of the organic light-emitting element, when the photo-curing and the heat-curing are completed in the final product, a difference in gel content between the edge of the curable pressure-sensitive adhesive layer which is not directly contact with the organic light-emitting element but photo-cured and a part of the curable pressure-sensitive adhesive layer directly contact with the organic light-emitting element, may be 10% or more. This is because the light-radiated part is additionally cured by light after being heat-cured and thus increased in gel content, compared with other parts only heat-cured.

The difference made by the method described above may be confirmed by investigating an unreacted material through GC analysis of each part of the curable pressure-sensitive adhesive layer in the final product. That is, when the photo-curing and the heat-curing are completed in the final product, unreacted materials of a photocurable pressure-sensitive adhesive composition are included at a smaller content in a photo-cured edge part of the curable pressure-sensitive adhesive layer, which is not directly contact with the organic light-emitting element than a part of the curable pressure-sensitive adhesive layer directly contact with the organic light-emitting element.

In addition, when the entirely encapsulated OED according to exemplary embodiments of the present invention is a top-emission type OED, the curable pressure-sensitive adhesive layer of the curable pressure-sensitive adhesive film may have a light transmissivity in a visible ray region (380 to 780 nm) of 90%, 95% or 98% or more, and haze of less than 2%, 1% or 0.5%.

The acrylic polymer may have a glass transition temperature of −60 to −10° C., or −30 to −10° C. When the glass transition temperature of the acrylic polymer is less than −60° C., problems such as a moisture barrier property and durability against high temperature and high humidity may be generated, and when the glass transition temperature of the acrylic polymer is more than −10° C., problems such as an assembling property and an adhesive property may be generated.

The acrylic polymer may have a weight average molecular weight of 400,000, 500,000 to 2,000,000 or 600,000 to 1,500,000. Within the above range, a pressure-sensitive adhesive balanced in workability including adhesive strength, durability against high temperature and high humidity, processibility including coating property and height difference prevention during assembly may be provided.

The acrylic polymer may include a crosslinkable functional group, for example, a polymerized form of an alkyl (meth)acrylate and a copolymerizable monomer having a crosslinkable functional group.

The alkyl(meth)acrylate may be an alkyl(meth)acrylate including an alkyl group having 1 to 14 carbon atoms in consideration of physical properties such as cohesive strength, a glass transition temperature and a pressure-sensitive adhesive property. Such an alkyl(meth)acrylate may be one or a polymerized form of at least two of methyl(meth)acrylate, ethyl(meth)acrylate, n-propyl(meth)acrylate, isopropyl(meth)acrylate, butyl(meth)acrylate, t-butyl(meth)acrylate, pentyl(meth)acrylate, 2-ethylhexyl(meth)acrylate, n-octyl(meth)acrylate, isooctyl(meth)acrylate, isononyl(meth)acrylate, isobonyl(meth)acrylate, methylethyl(meth)acrylate, lauryl(meth)acrylate and tetradecyl(meth)acrylate.

The copolymerizable monomer having a crosslinkable functional group may provide a crosslinkable functional group capable of being reacted with a multifunctional crosslinking agent to the acrylic polymer. The crosslinkable functional group may be a glycidyl group, an isocyanate group, a hydroxyl group, a carboxyl group, an amide group, an epoxide group, a cyclic ether group, a sulfide group, an acetal group, a lactone group or a nitrogen-containing group.

In the field of preparing an acrylic polymer, various copolymerizable monomers capable of providing such a crosslinkable functional group to an acrylic polymer are known, and the above-described monomers may be used without limitations. For example, a copolymerizable monomer having a hydroxyl group may be 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethyleneglycol(meth)acrylate or 2-hydroxypropyleneglycol(meth)acrylate, a copolymerizable monomer having a carboxyl group may be (meth)acrylic acid, 2-(meth)acryloyloxy acetic acid, 3-(meth)acryloyloxy propyl acid, 4-(meth)acryloyloxy butyl acid, acrylic acid dimer, itaconic acid, maleic acid or maleic anhydride, and a copolymerizable monomer having a nitrogen-containing group may be (meth)acrylamide, N-vinyl pyrrolidone or N-vinyl caprolactame, but the present invention is not limited thereto.

In one example, the acrylic polymer may include 80 to 99.9 parts by weight of an alkyl(meth)acrylate, and 0.1 to 20 parts by weight of a copolymerizable monomer providing a crosslinkable functional group as polymerized units. The term "parts by weight" used herein refers to a weight ratio. As the weight ratio between monomers is controlled as described above, physical properties such as initial adhesive strength, durability and peel strength of the curable pressure-sensitive adhesive layer may be effectively maintained.

The acrylic polymer may be prepared by a conventional polymerization method known in the art, for example, solution polymerization, photo polymerization, bulk polymerization, suspension polymerization or emulsion polymerization.

The curable pressure-sensitive adhesive composition may include a crosslinking agent having a functional group capable of being reacted with a crosslinkable functional group included in the above-described acrylic polymer as well as the polymer.

The kind of crosslinking agent is not particularly limited, and may be selected depending on the kind of crosslinkable functional group included in the polymer. For example, known crosslinking agents such as an isocyanate-based compound, an epoxy-based compound, an aziridine-based compound and a metal chelate-based compound may be used. In this case, the isocyanate-based compound may be tolylene diisocyanate, xylene diisocyanate, diphenylmethane diisocyanate, hexamethylene diisocyanate, isoboron diisocyanate, tetramethylxylene diisocyanate or naphthalene diisocyanate, and in some cases, a reaction product of at least one of the isocyanate compounds described above and a polyol (e.g., trimethylol propane). In addition, the epoxy-based compound may be at least one or more selected from the group consisting of ethyleneglycol diglycidylether, triglycidylether, trimethylolpropane triglycidylether, N,N,N',N'-tetraglycidyl ethylenediamine and glycerine diglycidylether, the aziridine-based compound may be at least one selected from the group consisting of N,N'-toluene-2,4-bis(1-aziridinecarboxide), N,N'-diphenylmethane-4,4'-bis(1-aziridinecarboxide), triethylene melamine, bisisoprotaloyl-1-(2-methylaziridine) and tri-1-aziridinylphosphineoxide, and the metal chelate-based compound may be a compound in which a polyvalent metal such as aluminum, iron, zinc, tin, titanium, antimony, magnesium and/or vanadium is coordinated with acetyl acetone or ethyl aceto acetate.

The curable pressure-sensitive adhesive composition may include the crosslinking agent at 0.01 to 10 or 0.1 to 5 parts by weight relative to 100 parts by weight of the acrylic polymer. Accordingly, cohesive strength of a cured product of the composition may be maintained in a suitable level, and a pot life may also be effectively controlled.

The curable pressure-sensitive adhesive composition encapsulating the OED according to exemplary embodiments of the present invention includes an epoxy resin having a functional group capable of serving as a crosslinking agent by a reaction with a crosslinkable functional group included in the above-described acrylic polymer as well as the polymer.

The term "epoxy resin" used herein refers to a resin having at least one epoxy group in a molecule. Here, the epoxy group may be an epoxy group binding to a cycloaliphatic ring, that is, a cycloaliphatic epoxy group. In this case, a hydrogen atom constituting the cycloaliphatic ring may be optionally substituted by a substituent such as an alkyl group.

The epoxy resin may be at least one selected from the group consisting of a multifunctional epoxy resin, bisphenol-based epoxy resins (a bisphenol A-type epoxy resin, a bisphenol F-type epoxy resin and a bisphenol AD-type epoxy resin), a novolac-type epoxy resin, a naphthalene-type epoxy resin, a trisphenolmethane-type epoxy resin, a glycidyl amine-type epoxy resin and a cycloaliphatic epoxy resin.

The curable pressure-sensitive adhesive composition may include the above-described epoxy resin at 1 to 30 or 5 to 20 parts by weight relative to 100 parts by weight of the acrylic polymer. When the weight ratio of the epoxy compound is excessively low, peel strength of a curable pressure-sensitive adhesive may be decreased, and when the weight ratio of the epoxy compound is excessively high, processibility and coating property of the composition may be degraded. Therefore, in consideration of these factors, a suitable content may be controlled.

The curable pressure-sensitive adhesive composition includes a photoinitiator. The photoinitiator may be, but is not particularly limited to, a cationic photopolymerization initiator. The term "cationic photopolymerization initiator" used herein refers to a compound capable of initiating cationic polymerization by radiation of light or a compound capable of producing a compound capable of initiating cationic polymerization by radiation of light.

The kind of cationic photopolymerization initiator is not particularly limited, and thus a known cationic photopolymerization initiator such as an aromatic diazonium salt, an aromatic iodine aluminum salt, an aromatic sulfonium salt or an iron-arene complex, and preferably, aromatic sulfonium salt may be used. However, the present invention is not limited thereto.

The photoinitiator may be included at 0.01 to 10 or 1 to 5 parts by weight relative to 100 parts by weight of the acrylic polymer. When the content of the photoinitiator is excessively low, curing may not be sufficiently performed, and when the content of the photoinitiator is excessively high, the content of the ionic material is increased after curing, thereby increasing an absorbing property of the curable outgassing. Therefore, in consideration of these factors, a suitable range of the content may be selected.

In the OED according to exemplary embodiments of the present invention, to secure a high moisture barrier property of the encapsulant, the curable pressure-sensitive adhesive composition may further include a moisture adsorbent. The term "moisture adsorbent" may include components capable of adsorbing or removing moisture or vapor input from the outside by a chemical reaction with moisture, and is called a moisture-reactive adsorbent.

A specific kind of moisture adsorbent capable of being used in exemplary embodiments of the present invention is not particularly limited, and may include one or a mixture of at least one or more of metal powder such as alumina, a metal oxide, an organic metal oxide, a metal salt and phosphorous pentoxide ($P_2O_5$).

A specific kind of metal oxide may be lithium oxide ($Li_2O$), sodium oxide ($Na_2O$), barium oxide (BaO), calcium oxide (CaO) or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

The metal oxides may be mixed with the composition in a state in which the moisture adsorbent is suitably processed. For example, depending on the kind of OED to which the curable pressure-sensitive adhesive film is to be applied, the curable pressure-sensitive adhesive layer may be a thin film having a thickness of 30 µm or less, and in this case, it may be necessary to perform a grinding process to the moisture adsorbent. To grind the moisture adsorbent, a process such as a 3-roll mill, bead mill or ball mill may be used. In addition, when the moisture adsorbent is applied to the top-emission type OED, transmissivity of the curable pressure-sensitive adhesive layer is very important, and thus it is necessary to decrease the size of the moisture adsorbent. Therefore, to be used in such a use, the moisture adsorbent is necessarily subjected to a grinding process.

The curable pressure-sensitive adhesive composition may include the above-described moisture adsorbent at 5 to 50 parts by weight, or 10 to 30 parts by weight relative to 100 parts by weight of the acrylic polymer.

The curable pressure-sensitive adhesive composition may include a filler, for example, an inorganic filler. The filler may inhibit penetration of moisture or vapor into an encapsulated structure by extending a traveling route of the moisture or vapor, and maximize a blocking property against moisture and vapor through a matrix structure of a resin and an interaction with the moisture adsorbent. A specific kind of filler capable of being used in exemplary embodiments of the present invention is not particularly limited, and may be one or a mixture of at least one or more of clay, talc, silica, barium sulfate, aluminum hydroxide, calcium carbonate, magnesium carbonate, zeolite, zirconia, titania or montmorillonite.

In addition, to increase binding efficiency between the filler and the resin, a product whose surface is treated with an organic material may be used as the filler, or a coupling agent may be further added to the filler.

The curable pressure-sensitive adhesive composition may include 1 to 100 or 5 to 30 parts by weight of the filler, relative to 100 parts by weight of the acrylic polymer. As the content of the filler is controlled to 1 part by weight or more, a cured product having excellent moisture or vapor blocking properties and mechanical properties may be provided. In addition, as the content of the filler is controlled to 100 parts by weight or less, a cured product capable of being formed in a film state, and exhibiting pressure-sensitive adhesive characteristics even when being formed in a thin film, may be provided.

The curable pressure-sensitive adhesive composition may further include one or at least two of additives such as a UV stabilizer, an antioxidant, a coloring agent, a reinforcing agent, a filler, a foaming agent, a surfactant, a photothickening agent and a plasticizer, in addition to the above-described components, without the influence on the effects of the present invention.

As described above, the curable pressure-sensitive adhesive composition used as the encapsulant is applied as the encapsulant after being formed into a separate curable pressure-sensitive adhesive film, which enables structural adhesion between the substrate and the top substrate. Therefore, a manufacturing process is simple during manufacture of an OED panel, and a decrease in encapsulation thickness of the OED may contribute to manufacturing a thinner OED.

A photocurable pressure-sensitive adhesive film according to exemplary embodiments of the present invention is a film-phase product including the photocurable pressure-sensitive adhesive composition for encapsulating an OED including the acrylic polymer, epoxy resin, crosslinking agent and photoinitiator, and includes a curable pressure-sensitive adhesive layer having a viscosity of $10^5$ to $10^7$ Pa·s at room temperature.

The curable pressure-sensitive adhesive layer of the curable pressure-sensitive adhesive film may be a monolayered structure, or a multilayered structure having at least two layers. When the curable pressure-sensitive adhesive film includes a multilayered curable pressure-sensitive adhesive layer, the moisture adsorbent may be more contained in a layer disposed far away from the organic light-emitting element.

The structure of the curable pressure-sensitive adhesive film is not particularly limited as long as the film includes the curable pressure-sensitive adhesive layer. For example, the curable pressure-sensitive adhesive film may have a structure including a base or release film (hereinafter, referred to as a "first film"); and the curable pressure-sensitive adhesive layer containing the composition, which is formed on the base or release film. The adhesive film may further include another base or release film (hereinafter, referred to as a "second film"), which is formed on the curable pressure-sensitive adhesive layer.

A specific kind of first film capable of being used in exemplary embodiments of the present invention is not particularly limited. As the first film, a polymer film generally used in the art may be used. For example, as the base or release film, a polyethyleneterephthalate film, a polytetrafluorethylene film, a polyethylene film, a polypropylene film, a polybutene film, a polybutadiene film, a vinylchloride copolymer film, a polyurethane film, ethylene-a vinylacetate film, an ethylene-propylene copolymer film, an ethylene-acrylic acid ethyl copolymer film, an ethylene-acrylic acid methyl copolymer film or a polyimide film may be used. In addition, suitable releasing treatment may be performed to one or both surfaces of the base or release film. As a releasing agent used in releasing treatment of the base film, an alkyd-based, silicon-based, fluorine-based, unsaturated ester-based, polyolefin-based or wax-based releasing agent, and preferably, for thermal resistance, an alkyd-based, silicon-based or fluorine-based releasing agent may be used, but the present invention is not limited thereto.

In addition, the kind of second film (hereinafter, also referred to as a "cover film") capable of being used in exemplary embodiments of the present invention is neither particularly limited. For example, the second film may be the same as or different from the first film within the range exemplified as the first film. In addition, the second film may also be subjected to suitable releasing treatment.

A thickness of the base or release film (first film) is not particularly limited, and may be suitably selected according to its use. For example, the first film may have a thickness of 10 to 500 µm or 20 to 200 µm. When the thickness of the film is controlled in the above range, transformation of the base film may be prevented and economic feasibility may be increased.

A thickness of the second film may neither be particularly limited. For example, the thickness of the second film may be set the same as that of the first film. Alternatively, in consideration of processibility, the thickness of the second film may be set relatively smaller than that of the first film.

A thickness of the curable pressure-sensitive adhesive layer included in the curable pressure-sensitive adhesive film is not particularly limited, and may be suitably selected in consideration of it use of the film.

The thickness of the curable pressure-sensitive adhesive layer included in the curable pressure-sensitive adhesive film may be 5 to 200 µm or 10 to 100 µm. When the thickness of the curable pressure-sensitive adhesive layer is less than 5 µm, a burying property and processibility may be degraded when the curable pressure-sensitive adhesive film is used as an encapsulant of the OED, and when the thickness of the curable pressure-sensitive adhesive layer is more than 200 µm, economic feasibility is degraded.

A method of forming the curable pressure-sensitive adhesive film is not particularly limited. For example, the curable pressure-sensitive adhesive film may be formed by a method including a coating solution including the composition for a curable pressure-sensitive adhesive layer on a base or release film (first operation), and drying the coating solution coated in the first operation (second operation). The method for forming the curable pressure-sensitive adhesive film may further include additionally compressing a base or release film on the coating solution dried in the second operation (third operation).

The first operation is to prepare a coating solution by dissolving or dispersing the composition for a curable pressure-sensitive adhesive layer in a suitable solvent. The kind of solvent used in the preparation of a coating solution is not particularly limited. However, since drying time of the solvent is excessively long, or the solvent is necessarily dried at high temperature, problems may arise in terms of workability or durability of the curable pressure-sensitive adhesive film, and a solvent having a volatilization temperature of 100° C. or less may be used. Moreover, in consideration of film moldability, a small amount of solvent having a volatilization temperature within the above range or more may be mixed. The solvent may be, but is not limited to, one or a mixture of at least two of methylethylketone (MEK), acetone, toluene, dimethylformamide (DMF), methylcellosolve (MCS), tetrahydrofuran (THF) or N-methylpyrrollidone (NMP).

In the first operation, a method for coating the coating solution on a base or release film is not particularly limited, and a known method such as knife coating, roll coating, spray coating, gravure coating, curtain coating, comma coating or lip coating may be used without limitation.

The second operation is to form a curable pressure-sensitive adhesive layer by drying the coating solution coated in the first operation. That is, in the second operation, a curable pressure-sensitive adhesive layer may be formed by drying and removing a solvent by heating the coating solution coated to the film. Here, a drying condition is not particularly limited, and the drying may be performed at 70 to 200° C. for 1 to 10 minutes.

In the forming method, followed by the second operation, the third operation of compressing an additional base or release film on the curable pressure-sensitive adhesive layer formed on the film, may be further performed. In the third operation, the additional release or base film (cover film or second film) may be compressed on the dried curable pressure-sensitive adhesive layer coated on the film by a hot-roll lamination or pressing process. Here, the third operation may be performed by hot-roll lamination in terms of possibility and efficiency of a continuous process, and the process may be performed at a temperature of approximately 10 to 100° C. and a pressure of approximately 0.1 to 10 kgf/cm.

In another exemplary embodiment of the present invention, a protective layer for protecting an organic light-emitting element may be further included between an encapsulant by the curable pressure-sensitive adhesive film and the organic light-emitting element.

The OED may further include an encapsulation substrate (top substrate) on the encapsulant, and the curable pressure-sensitive adhesive film serves to adhere the encapsulation substrate (top substrate) to a bottom plate (bottom substrate).

In still another exemplary embodiment of the present invention, the present invention provides a method for manufacturing an OED including assembling a photocurable pressure-sensitive adhesive film including an acrylic polymer, an epoxy resin, a crosslinking agent and a photoinitiator with an top substrate; assembling the top substrate to the bottom substrate on which an organic light-emitting element is formed to cover an entire surface of the organic light-emitting element with the curable pressure-sensitive adhesive layer, and radiating light only to an edge of the assembled top and bottom substrates in which the organic light-emitting element is not disposed to photocure.

Hereinafter, the method for manufacturing an OED will be described with reference to the accompanying drawings. FIG. 2 is a schematic diagram showing a process of manufacturing an OED according to an aspect of the present invention.

To manufacture an OED according to exemplary embodiments of the present invention, first, the curable pressure-sensitive adhesive film is assembled with an top substrate (encapsulation substrate). As the top substrate (encapsulation substrate), glass or a polymer substrate may be used, but the present invention is not limited thereto.

Subsequently, the top substrate is assembled with the bottom substrate on which an organic light-emitting element is formed to cover the entire surface of the organic light-emitting element with a curable pressure-sensitive adhesive layer. That is, the top substrate and the bottom substrate are assembled such that a surface of the curable pressure-sensitive adhesive layer of the top substrate with which the curable pressure-sensitive adhesive layer is assembled, is in contact with the organic light-emitting element.

A transparent electrode is formed on the glass or polymer film used as the bottom substrate by vacuum deposition or sputtering, and a hole transport layer and an organic light-emitting element (e.g., OLED) are formed on the transparent electrode. Subsequently, an electrode layer is further formed on the formed organic light-emitting element. Afterward, the top substrate with which the curable pressure-sensitive adhesive layer (encapsulant) is assembled is assembled with the bottom substrate subjected to the above-described process to cover an entire surface of the organic light-emitting element with the curable pressure-sensitive adhesive layer. The assembling method may be selected from an assembling method by applying heat and pressure in a vacuum, a roll-lamination method by applying only heat, and a method using an autoclave.

Subsequently, light is radiated only to an edge of the assembled top and bottom substrates to photo-cure. In one example, light is selectively radiated only to the edge surrounding the organic light-emitting element to avoid the radiation of light to the organic light-emitting element using a mask having a size exposing the edge not directly contact with the organic light-emitting element of the curable pressure-sensitive adhesive layer. The radiation of light during photocuring may be freely performed from top to bottom or vice versa by a method which does not causes the least damage to convenience of the process and a panel.

The photocuring operation may be followed by an additional low-temperature thermal curing (aging) process to prevent damage to elements by an unreacted material, and enhance adhesive strength and a moisture blocking property. The aging process may be performed at a low temperature of 30 to 80° C. for 30 minutes to 3 hours.

In the method of manufacturing an OED according to exemplary embodiments of the present invention, the curable pressure-sensitive adhesive film formed using a curable pressure-sensitive adhesive composition is attached to a top plate, that is, an encapsulation substrate not having an organic light-emitting element, and then light is radiated thereto. Subsequently, a bottom plate having an organic light-emitting element is assembled with the top plate, and then post-curing is performed by a dark reaction. Therefore, it is possible to cure the entire surfaces of the bottom and top places without damage to elements by light.

Hereinafter, the present invention will be described in further detail with reference to Examples according to the present invention and Comparative Examples not according to the present invention, but the scope of the present invention is not limited to the following Examples.

Example 1

Formation of Curable Pressure-Sensitive Adhesive Film and OED

An acrylic polymer having a glass transition temperature of approximately −20° C. and a weight average molecular weight of 1,000,000 was prepared by polymerizing a pressure-sensitive adhesive containing 15 parts by weight of butyl acrylate, 40 parts by weight of methylethylacrylate, 20 parts by weight of isobornylacrylate, 15 parts by weight of methyl acrylate, and 10 parts by weight of hydroxyethylacrylate.

A coating solution was prepared to have a solid content of 20% by adding 0.2 parts by weight of an isocyanate-based crosslinking agent (xylene diisocyanate, T-39M), 5 parts by weight of a trimethylopropane-type epoxy resin (SR-TMP, SAKAMOTO), 0.25 parts by weight of a triarylsulfonate-type cationic photopolymerization initiator (CPI-110A, SAN-APRO Ltd.), relative to 100 parts by weight of the acrylic polymer, and ethylacetate as a solvent.

A curable pressure-sensitive adhesive film (having a viscosity at 25° C. of approximately $10^6$ Pa·s) including a curable pressure-sensitive adhesive layer having a thickness of 40 μm by coating a 50-μm PET release film with the coating solution, drying the coated film in an oven at 100° C. for 10 minutes, and covering the dried film with a 25-μm PET release film, was prepared.

After one of the PET release films was removed from the formed curable pressure-sensitive adhesive film, the curable pressure-sensitive adhesive film was assembled with a glass (top plate) for encapsulation first, the underlying PET release film was also removed, the top plate was assembled with a bottom plate having an OLED by applying heat of 70° C. and pressure of approximately 2 kgf in a vacuum degree of less than 100 mTorr using a vacuum assembly system, and photocuring was performed by radiating a UV ray having an intensity of 10 J/cm$^2$ to an edge of the substrate using a mask, excluding the part that was not exposed by the mask as shown in FIGS. 1 and 2. Subsequently, the mask was removed, and then the partially-cured curable pressure-sensitive adhesive film was aged in an oven of 80° C. for 3 hours (post-curing).

Example 2

All of the processes were performed as described in Example 1, except that 10 parts by weight of a metal oxide (MgO), relative to 100 parts by weight of the acrylic polymer was added to the coating solution as a moisture adsorbent Example 3

All of the processes were performed as described in Example 1, except that post-curing (aging process) was excluded.

Comparative Example 1

All of the processes were performed as described in Example 1, except that a coating solution was prepared without an isocyanate crosslinking agent.

Comparative Example 2

All of the processes were performed as described in Example 1, except that 5 parts by weight of YD-128 (Kukdo chemical) was used as an epoxy resin.

Comparative Example 3

All of the processes were performed as described in Example 1, except that the acrylic polymer used in Example 1 was only used, excluding an isocyanate-based crosslinking agent, a trimethylopropane-type epoxy resin and a triarylsulfonate-type cationic photopolymerization initiator.

Comparative Example 4

All of the processes were performed as described in Example 1, except that 40 parts by weight of the trimethylopropane-type epoxy resin (SR-TMP, SAKAMOTO) used in Example 1 was used.

Experimental Example 1

Evaluation of Water Vapor Transmission Rate

After the curable pressure-sensitive adhesive films formed in Examples 1 and 3 and Comparative Examples 1 to 4 were heat-cured, water vapor transmission rate per area of 1 cm$^2$ was measured using the PERMATRAN-W Model 3/61 produced by MOCON under conditions of a temperature of 37.8° C. and relative humidity of 100%. The measurement results are shown in Table 1 (however, the measured part was irradiated by UV rays).

Experimental Example 2

Measurement of Transmissivity and Haze

The curable pressure-sensitive adhesive films formed in Examples 1 and 3 and Comparative Examples 1 to 4 were subjected to measurement of transmissivity and haze using a haze meter HR-100(Murakami Color Research Laboratory), and the measurement results are shown in Table 1 (however, the measured part was not irradiated by UV rays and transmitted by light).

Experimental Example 3

Evaluation of Adhesive Strength

After the curable pressure-sensitive adhesive films formed in Examples 1 and 3 and Comparative Examples 1 to 4 were cut to a size of 25 mm×100 mm and laminated on a glass, the film subjected to curing was measured in peel strength when being peeled off at an angle of 180°. A pulling rate was 300 mm/min, and then an average was obtained after the peel strength was measured twice per each sample, the results of which are shown in Table 1 (however, the measured part was irradiated by UV rays).

TABLE 1

| Category | WVTR (g/m$^2$ · 24 h, 100 μm base) | Transmissivity (%) | Haze (%) | Adhesive Strength (gf/25 mm) |
|---|---|---|---|---|
| Example 1 | 95 | >98 | <1 | 533 |
| Example 3 | 155 | >98 | <1 | 499 |
| C. Example *1 | 168 | >98 | <1 | 495 |
| C. Example 2 | 177 | >98 | <1 | 666 |
| C. Example 3 | Unmeasurable (500<) | >98 | <1 | 1020 |
| C. Example 4 | 83 | >98 | <1 | 135 |

* C. Example: Comparative Example

Comparative Example 5

The processes were performed as described in Example 1, except that one PET release film was removed from the curable pressure-sensitive adhesive film formed in Example 1, the film was assembled with a glass (top plate) for encapsulation, the other PET release film was also removed, a bottom plate having an OLED was assembled with the top plate by applying heat of 70° C. and pressure of approximately 2 kgf in a vacuum degree of 100 mTorr using a vacuum assembly machine before the radiation of light, and then a UV ray having an intensity of 10 J/cm$^2$ was radiated to an entire region without a mask.

Experimental Example 4

Confirmation of Damage to Element

Comparing color coordinates of an organic light-emitting element between the OEDs formed in Example 1 and Comparative Example 5, it could be confirmed that the color coordinate of the organic light-emitting element in Comparative Example 5 was changed 5% or more compared with that of Example 1, and lifespan, under high temperature and high humidity in Comparative Example 5, was 10% or more shorter than that in Example 1.

According to exemplary embodiments of the present invention, an OED encapsulated using a curable pressure-sensitive adhesive film has excellent moisture blocking properties and adhesive strength, thereby effectively encapsulating the OED from moisture. It can be also confirmed that the OED has suitable light transmissivity and haze as a top-emission type device, and thus the OED may be effectively encapsulated from moisture.

What is claimed is:

1. An organic electronic device, comprising:
    a substrate;
    an organic light-emitting element formed on a portion of the substrate; and
    a heat-cured product of a curable pressure-sensitive adhesive film encapsulating:
        an entire surface of the organic light-emitting element, and
        an area of the substrate where the organic light-emitting element is not formed,
    wherein the curable pressure-sensitive adhesive film comprises a curable pressure-sensitive adhesive layer comprising a photocurable pressure-sensitive adhesive composition comprising an acrylic polymer, an epoxy resin, a crosslinking agent and a photoinitiator,
    wherein the heat-cured product of the curable pressure-sensitive adhesive film has a photocured part only on the area that covers the substrate where the organic light-emitting element is not formed,
    wherein a difference in gel content between the photocured part and a part that covers the organic light-emitting element of the heat-cured product of the curable pressure-sensitive adhesive film is 10% or more, and
    wherein the heat-cured product of the curable pressure-sensitive adhesive film is formed by photocuring the area of the curable pressure-sensitive adhesive layer that covers the substrate where the organic light-emitting element is not formed, and then, heat-curing the curable pressure-sensitive adhesive layer at a temperature in a range of 30 to 80° C. after phtocuring.

2. The device of claim 1,
    wherein the photocured part surrounds a circumference of the organic light-emitting element.

3. The device of claim 1,
    wherein, in the heat-cured product of the photocurable pressure-sensitive adhesive film, a concentration of unreacted materials of the photocurable pressure-sensitive adhesive composition in the part that covers the organic light-emitting element is lower than that of the photocured part.

4. The device of claim 1,
    wherein the curable pressure-sensitive adhesive film is semi-solid at room temperature, and has a viscosity of $10^5$ to $10^7$ Pa·s.

5. The device of claim 1,
    wherein the acrylic polymer has a weight average molecular weight of 400,000 to 2,000,000.

6. The device of claim 1,
    wherein the acrylic polymer comprises a crosslinkable functional group, and comprises an alkyl (meth)acrylate and a copolymerizable monomer having a crosslinkable functional group in a polymerized form.

7. The device of claim 6,
    wherein the crosslinkable functional group is at least one or more selected from a glycidyl group, an isocyanate group, a hydroxyl group, a carboxyl group, an amide group, an epoxide group, a cyclic ether group, a sulfide group, an acetal group and a lactone group.

8. The device of claim 1,
    wherein the epoxy resin is at least one or more selected from the group consisting of a multifunctional epoxy resin, a bisphenol-based epoxy resin, a novolac-type epoxy resin, a naphthalene-type epoxy resin, a triphenolmethane-type epoxy resin, a glycidyl amine-type epoxy resin and a cycloaliphatic epoxy resin.

9. The device of claim 1,
    wherein the photocurable pressure-sensitive adhesive composition comprises the epoxy resin in an amount of 1 to 30 parts by weight, relative to 100 parts by weight of the acrylic polymer.

10. The device of claim 1,
    wherein the crosslinking agent is an isocyanate-based compound, an epoxy-based compound, an aziridine-based compound or a metal chelate-based compound.

11. The device of claim 1,
    wherein the photocurable pressure-sensitive adhesive composition comprises the crosslinking agent in an amount of 0.01 to 10 parts by weight, relative to 100 parts by weight of the acrylic polymer.

12. The device of claim 1,
    wherein the photoinitiator is a cationic photopolymerization initiator.

13. The device of claim 12,
    wherein the cationic photopolymerization initiator is an aromatic diazonium salt, an aromatic iodine aluminum salt, an aromatic sulfonium salt or an iron-arene complex.

14. The device of claim 1,
    wherein the photocurable pressure-sensitive adhesive composition comprises the photoinitiator in an amount of 0.01 to 10 parts by weight, relative to 100 parts by weight of the acrylic polymer.

15. The device of claim 1,
    wherein the photocurable pressure-sensitive adhesive composition further comprises a moisture adsorbent.

16. The device of claim 15,
    wherein the moisture adsorbent is an alumina, metal oxide, organic metal oxide, metal salt or phosphorus pentoxide.

17. The device of claim 15,
    wherein the moisture adsorbent is at least one or more selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

18. The device of claim 1,
    wherein the photocurable pressure-sensitive adhesive composition further comprises a filler.

19. The device of claim 18,
    wherein the filler is at least one or more selected from the group consisting of clay, talc, silica, barium sulfate, aluminum hydroxide, calcium carbonate, magnesium carbonate, zeolite, zirconia, titania or montmorillonite.

20. The device of claim 1, further comprising:
    a protective layer encapsulating the organic light-emitting element between the curable pressure-sensitive adhesive film and the organic light-emitting element.

21. A method for manufacturing the organic electronic device of claim 1, comprising:
- laminating a photocurable pressure-sensitive adhesive film comprising a curable pressure-sensitive adhesive layer comprising an acrylic polymer, an epoxy resin, a crosslinking agent and a photoinitiator with a top substrate;
- laminating the top substrate with the a bottom substrate on which an organic light-emitting element is formed to cover an entire surface of the organic light-emitting element with the curable pressure-sensitive adhesive layer,
- radiating a light to an area of the assembled top and bottom substrates in which the organic light-emitting element is not disposed, to photocure the curable pressure-sensitive adhesive layer, and
- heat-curing the curable pressure-sensitive adhesive layer at a low temperature in a range of 30 to 80° C. after radiating the light.

22. The method of claim 21,
- wherein the heat-curing is performed for 30 minutes to 3 hours.

23. A photocurable pressure-sensitive adhesive composition for encapsulating an organic electronic device of claim 1, comprising:
- an acrylic polymer, an epoxy resin, a crosslinking agent and a photoinitiator.

24. A photocurable pressure-sensitive adhesive film for encapsulating an organic electronic device, comprising the composition of claim 23,
- wherein the photocurable pressure-sensitive adhesive layer has a viscosity at 25° C. of $10^5$ to $10^7$ Pa·s.

* * * * *